(12) United States Patent
Otsubo et al.

(10) Patent No.: US 12,193,148 B2
(45) Date of Patent: Jan. 7, 2025

(54) MODULE

(71) Applicant: Murata Manufacturing Co., Ltd., Nagaokakyo (JP)

(72) Inventors: Yoshihito Otsubo, Nagaokakyo (JP); Tadashi Nomura, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 102 days.

(21) Appl. No.: 17/461,553

(22) Filed: Aug. 30, 2021

(65) Prior Publication Data

US 2021/0392738 A1  Dec. 16, 2021

Related U.S. Application Data

(63) Continuation of application No. PCT/JP2020/011130, filed on Mar. 13, 2020.

(30) Foreign Application Priority Data

Mar. 15, 2019  (JP) .................. 2019-048223

(51) Int. Cl.
*H05K 1/02* (2006.01)
*H05K 1/18* (2006.01)
*H05K 3/28* (2006.01)

(52) U.S. Cl.
CPC ........... *H05K 1/0218* (2013.01); *H05K 1/181* (2013.01); *H05K 3/28* (2013.01); *H05K 2201/0715* (2013.01)

(58) Field of Classification Search
CPC .......... H05K 1/02; H05K 1/0218; H05K 1/18; H05K 1/181–187; H05K 3/28; H05K 3/4629; H01L 23/00; H01L 23/552

USPC ............... 361/764, 784, 816, 818; 174/520; 257/659–663
See application file for complete search history.

(56) References Cited

U.S. PATENT DOCUMENTS

| | | | |
|---|---|---|---|
| 7,635,519 B2* | 12/2009 | Onoue ................. | H01G 4/30 428/323 |
| 8,125,788 B2* | 2/2012 | Hatanaka ............. | H03H 9/0542 361/764 |
| 10,064,318 B2* | 8/2018 | Jang .................... | H05K 1/023 |
| 10,170,428 B2* | 1/2019 | Pietambaram ...... | H01L 23/5385 |
| 10,840,229 B2* | 11/2020 | Yoo .................... | H01L 23/5384 |

(Continued)

FOREIGN PATENT DOCUMENTS

| | | |
|---|---|---|
| JP | 2011165931 A | 8/2011 |
| JP | 2014203881 A | 10/2014 |
| WO | 2018164158 A1 | 9/2018 |

OTHER PUBLICATIONS

Written Opinion of the International Searching Authority issued for PCT/JP2020/011130, date of mailing Jun. 16, 2020.

(Continued)

*Primary Examiner* — Tuan T Dinh
(74) *Attorney, Agent, or Firm* — ArentFox Schiff LLP

(57) ABSTRACT

A module is provided that includes a wiring substrate having a major surface, a plurality of components mounted on the major surface, and a conductor incorporated resin body mounted on the major surface. Moreover, the conductor incorporated resin body is disposed between the plurality of components and includes a conductor pattern therein that is grounded.

17 Claims, 11 Drawing Sheets

(56) References Cited

U.S. PATENT DOCUMENTS

| | | | |
|---|---|---|---|
| 2002/0118520 A1* | 8/2002 | Baker | H05K 1/0218 |
| | | | 361/752 |
| 2006/0076651 A1* | 4/2006 | Tsutsue | H01L 23/564 |
| | | | 257/669 |
| 2007/0081312 A1* | 4/2007 | Noda | H01L 23/552 |
| | | | 257/E23.062 |
| 2012/0320559 A1* | 12/2012 | Kimura | H01L 23/552 |
| | | | 361/818 |
| 2013/0271928 A1* | 10/2013 | Shimamura | H05K 13/00 |
| | | | 29/841 |
| 2014/0293550 A1 | 10/2014 | Mugiya et al. | |
| 2016/0323996 A1* | 11/2016 | Takemura | G01R 31/2889 |
| 2018/0092201 A1* | 3/2018 | Otsubo | H01L 23/5386 |
| 2018/0096967 A1* | 4/2018 | Tsai | H01L 23/16 |
| 2018/0151485 A1* | 5/2018 | Kao | H01L 23/552 |
| 2018/0182691 A1* | 6/2018 | Cho | H01L 24/20 |
| 2019/0393166 A1 | 12/2019 | Otsubo | |

OTHER PUBLICATIONS

International Search Report issued for PCT/JP2020/011130, date of mailing Jun. 16, 2020.

\* cited by examiner

MODULE

CROSS REFERENCE TO RELATED APPLICATIONS

The present application is a continuation of PCT/JP2020/011130 filed Mar. 13, 2020, which claims priority to Japanese Patent Application No. 2019-048223, filed Mar. 15, 2019, the entire contents of each of which are incorporated herein by reference.

TECHNICAL FIELD

The present invention relates to a module.

BACKGROUND

Japanese Patent Laid-Open No. 2014-203881 (hereinafter "Patent Document 1") describes that, for a circuit module, a thickening portion is provided to a wiring portion of a wiring substrate in forming a conductive shield by forming a groove in a sealing resin by laser-processing, and filling the groove with a conductive resin or a conductive paint.

According to the configuration of PTL 1, the groove is formed in the sealing resin by laser processing, and an incorporated component may be damaged when laser processing is performed. Further, when laser processing is performed, for example, scanning of a laser beam is temporarily stopped at a portion corresponding to a corner of the groove, and when the groove has a curved portion, the wiring substrate may be significantly damaged at the curved portion even with the thickening portion provided.

Further, according to PTL 1, while a thickening portion of wiring is formed on the wiring substrate, in order to protect the wiring substrate, the thickening portion is formed of a metal component or the like, and thus sacrifices a component mountable area on the wiring substrate. This configuration inhibits miniaturization of the module.

SUMMARY OF THE INVENTION

Accordingly, it is an object of the present invention to provide a module that allows a shield to be disposed in a vicinity of a mounted component without damaging a wiring substrate. Moreover, the configuration enables miniaturization of the module.

Thus, in an exemplary aspect, a module is provided that comprises a wiring substrate having a major surface, a plurality of components mounted on the major surface, and a conductor incorporated resin body mounted on the major surface. Moreover, the conductor incorporated resin body is disposed between the plurality of components. The conductor incorporated resin body includes a conductor pattern therein, and the conductor pattern is grounded.

According to the exemplary aspects of the present invention, the conductor incorporated resin body is configured as a shield, and the shield can be disposed in a vicinity of a mounted component without damaging the wiring substrate.

DETAILED DESCRIPTION OF EMBODIMENTS

In general, the figures indicate a dimensional ratio, which does not necessarily provide a representation according to scale, and may be exaggerated for convenience of illustration. In the following description, when referring to a concept of being upper or lower, it does not necessarily mean being absolutely upper or lower and may instead mean being relatively upper or lower in a position shown in a figure.

First Exemplary Embodiment

Figure 1:
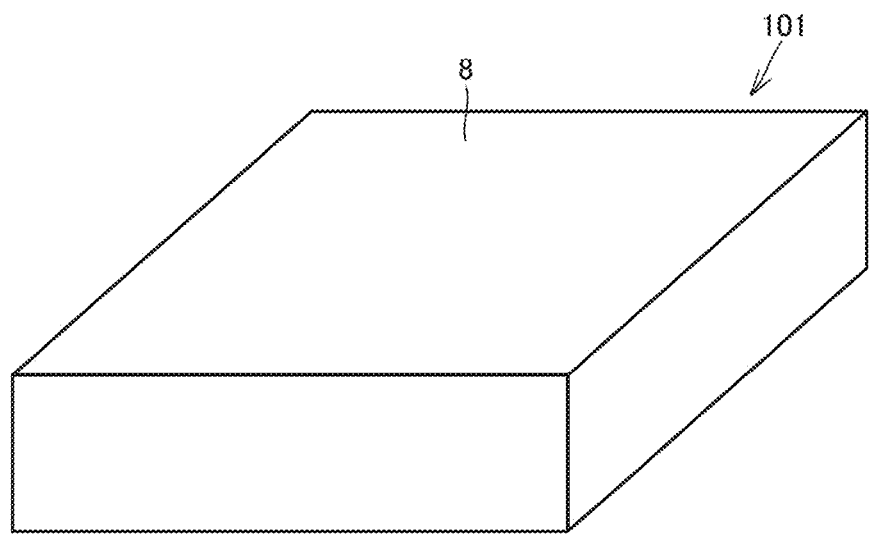
FIG. 1 is a perspective view of a module according to a first exemplary embodiment.
Figure 2:
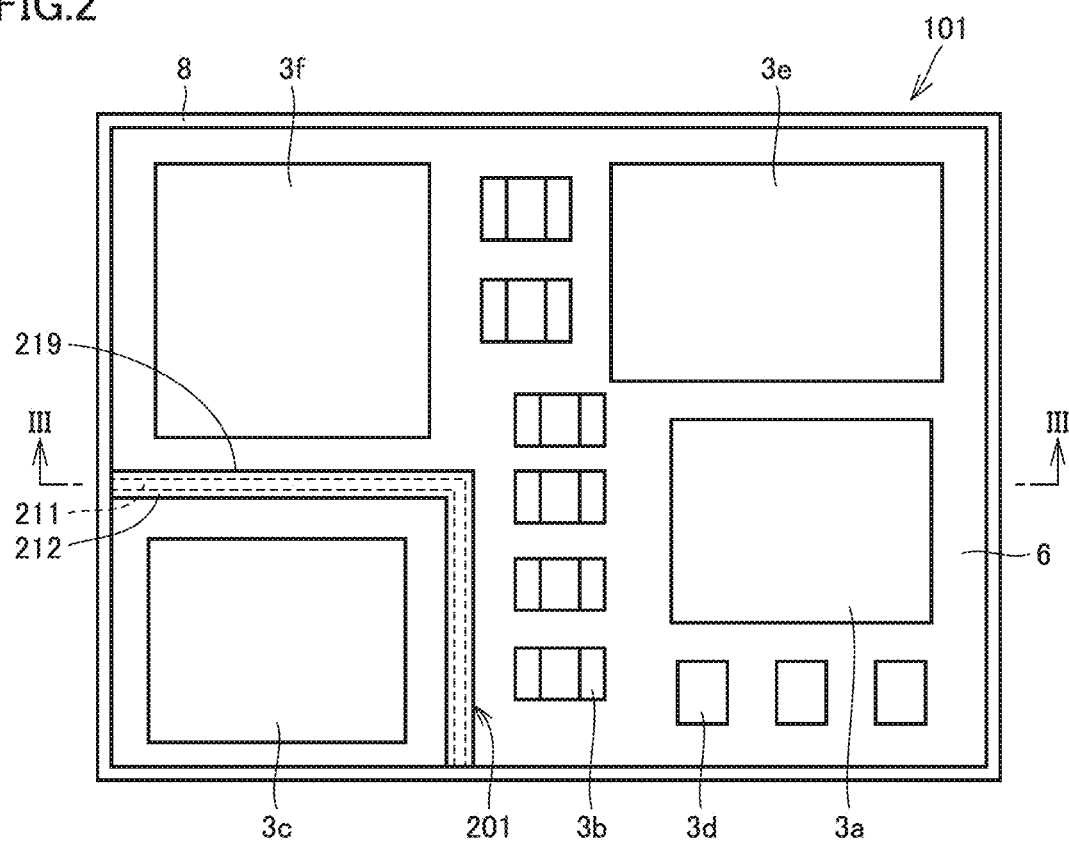
FIG. 2 is a transparent plan view of the module according to the first exemplary embodiment.
Figure 3:
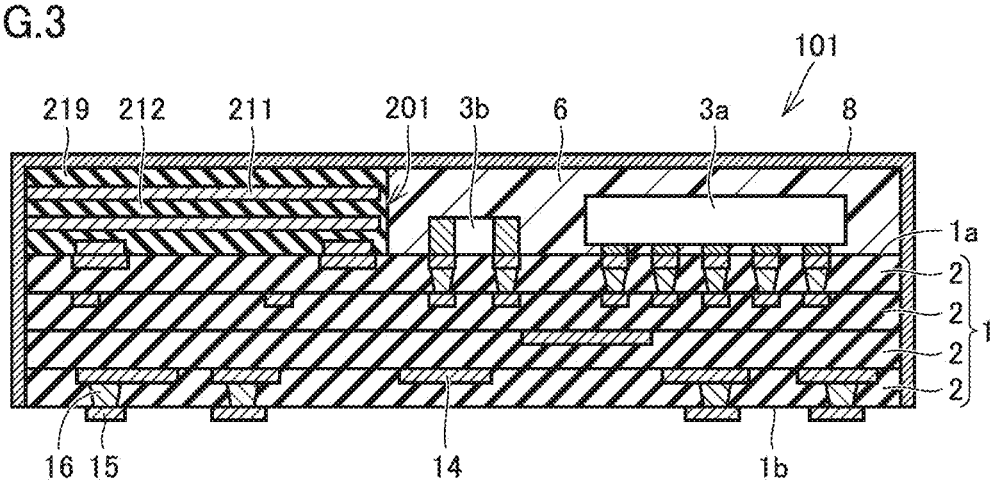
FIG. 3 is a cross section taken along a line indicated in FIG. 2.

A module according to a first exemplary embodiment will now be described with reference to FIGS. 1 to 4. FIG. 1 shows an external view of a module 101 according to the present embodiment. Module 101 has upper and side surfaces covered with a shield film 8. A sealing resin 6 (see FIG. 3), which will be described hereinafter, is disposed in a space inside shield film 8. A transparent plan view of module 101 is shown in FIG. 2. For purposes of this disclosure, the phrase "transparent plan view" as referred to herein means a plan view in a state in which shield film 8 covering the upper surface of module 101 is removed and sealing resin 6 introduced in the space inside shield film 8 is also removed. In the other following embodiments as well, when a "transparent plan view" is referred to, it shall mean a similar plan view. FIG. 3 is a cross section taken along a line indicated in FIG. 2. Note, however, that the cross section shows a state in which shield film 8 and sealing resin 6 covering the upper surface are present. The same applies to the other following embodiments.

In this aspect, module 101 comprises a wiring substrate 1 having a major surface 1*a* (e.g., a first principal surface), a plurality of components 3*a* to 3*f* mounted on major surface 1*a*, and a conductor incorporated resin body 201 mounted on major surface 1*a*. Conductor incorporated resin body 201 includes a conductor pattern 211 therein. Conductor pattern 211 is grounded. Conductor pattern 211 is grounded by electrically connecting shield film 8 formed on the side surface of module 101 to conductor pattern 211, and furthermore, electrically connecting shield film 8 to a GND electrode provided to wiring substrate 1. Wiring substrate 1 has a lower surface 1*b* (e.g., a second principal surface) as a surface opposite to major surface 1*a*. An external electrode 15 is disposed on lower surface 1*b*. A conductor pattern 14 and a conductor via 16 are appropriately disposed in wiring substrate 1. In the example shown in FIG. 3, conductor via 16 connected to external electrode 15 is shown.

Figure 4:
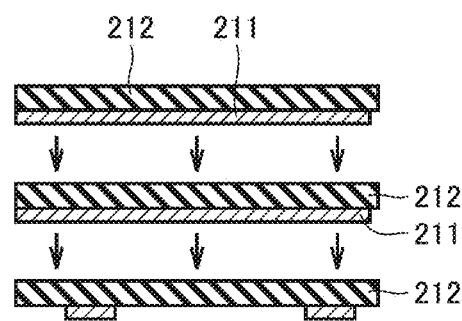
FIG. 4 is an exploded view of a conductor incorporated resin body included in the module according to the first exemplary embodiment.

FIG. 4 is an exploded view of conductor incorporated resin body 201. Conductor incorporated resin body 201 is formed, for example, by stacking a plurality of resin layers 212 and bonding them together by thermal compression bonding. Conductor pattern 211 is formed on some of the plurality of resin layers 212. Conductor pattern 211 is disposed on one or opposite surfaces of resin layer 212. In this way, conductor incorporated resin body 201 is configured as a multilayer resin substrate.

As shown in FIG. 2, components 3*a*, 3*b*, 3*c*, 3*d*, 3*e* and 3*f* are mounted on major surface 1*a* of wiring substrate 1. Sealing resin 6 is disposed to seal component 3*a*, 3*b*, 3*c*, 3*d*, 3*e* and 3*f*. Shield film 8 is formed so as to cover upper and side surfaces of sealing resin 6. Moreover, conductor pattern 211 is electrically connected to a portion of shield film 8 covering the side surface of sealing resin 6.

While wiring substrate 1 is a low temperature co-sintered ceramic substrate, it may be a resin substrate. The sealing resin is, for example, epoxy resin. The conductor incorporated resin body is, for example, a stack of resin sheets each having a copper foil attached thereto with a prescribed pattern formed. The resin sheet is made of a thermoplastic resin. The thermoplastic resin as referred to herein is, for example, any of liquid crystal polymer (LCP), polyether ether ketone (PEEK), thermoplastic polyimide (thermoplastic PI), thermoplastic fluororesin, and the like.

In the present embodiment, conductor incorporated resin body 201 includes a wall-shaped portion 219 (or simply a "wall"). In an example indicated in the present embodiment, conductor incorporated resin body 201 is entirely wall-shaped portion 219. Moreover, conductor pattern 211 is disposed in the wall-shaped portion and can be a linear pattern in an exemplary aspect.

In the exemplary aspect, conductor incorporated resin body 201 has an L-shape in plan view. Moreover, conductor incorporated resin body 201 has opposite ends electrically connected to shield film 8. In one aspect, conductor incorporated resin body 201 is disposed between components 3*c* and 3*f*. Furthermore, conductor incorporated resin body 201 is disposed between components 3*c* and 3*b*. That is, conductor incorporated resin body 201 is disposed between a plurality of mounted components. In the present embodiment, component 3*c* is disposed with two sides thereof surrounded by the L-shaped conductor incorporated resin body 201 as shown in FIG. 2, for example. When attention is paid to a combination of the L-shaped conductor incorporated resin body 201 and shield film 8, component 3*c* has its periphery entirely surrounded by a conductor in plan view. That is, conductor incorporated resin body 201 is disposed so as to isolate a portion of sealing resin 6 from another portion thereof and conductor pattern 211 is connected to shield film 8.

In the present embodiment, conductor incorporated resin body 201 having conductor pattern 211 incorporated therein is mounted on major surface 1*a* of wiring substrate 1, and conductor incorporated resin body 201 is configured as a shield. Conductor incorporated resin body 201 is only mounted on major surface 1*a*, and laser processing is not required for mounting it in an exemplary aspect. Therefore, the wiring substrate is not damaged.

As described above, in the present embodiment, a shield can be disposed in a vicinity of a mounted component without damaging a wiring substrate.

As has been indicated in the present embodiment, preferably, the conductor incorporated resin body 201 comprised by the module includes a wall-shaped portion, the wall-shaped portion has the conductor pattern disposed therein, and the conductor pattern is a linear pattern. With this configuration, the conductor incorporated resin body can be mounted while occupying a small area, and a shield can be configured by the incorporated conductor pattern. While the example indicated in the present embodiment is predicated on that conductor incorporated resin body 201 is entirely wall-shaped portion 219, the conductor incorporated resin body may have a structure including a wall-shaped portion and a portion other than the wall-shaped portion. That is, preferably, at least a part of the conductor incorporated resin body is a wall-shaped portion.

As indicated in the present embodiment, preferably, sealing resin 6 that seals the component on major surface 1*a* is provided, and the wall-shaped portion is disposed so as to isolate a portion of sealing resin 6 from another portion. By adopting this configuration, a compartment shield is implemented.

As indicated in the present embodiment, preferably, shield film 8 that covers the upper and side surfaces of sealing resin 6 is provided, shield film 8 is grounded, and the wall-shaped portion is disposed so that the conductor pattern is electrically connected to shield film 8. By adopting this configuration, a shield configured by the wall-shaped portion of the conductor incorporated resin body can be grounded by the surrounding shield film 8, and the entire shield can thus be grounded efficiently.

While the present embodiment has been described by referring to an example in which conductor incorporated resin body 201 is formed by stacking a plurality of resin layers 212 and bonding them together by thermal compression bonding, that is, a multilayer resin substrate, the "conductor incorporated resin body" is not limited to a multilayer resin substrate. The conductor incorporated resin body may be any object formed of resin with some conductor incorporated therein. It is noted that the conductor incorporated resin body implemented by a multilayer resin substrate has been indicated by way of example. Moreover, the conductor incorporated resin body can be produced in a different method.

The conductor incorporated resin body is preferably a multilayer resin body. By adopting this configuration, the conductor incorporated resin body can be produced by stacking resin layers, and thus easily formed in a desired structure.

Second Exemplary Embodiment

Figure 5:
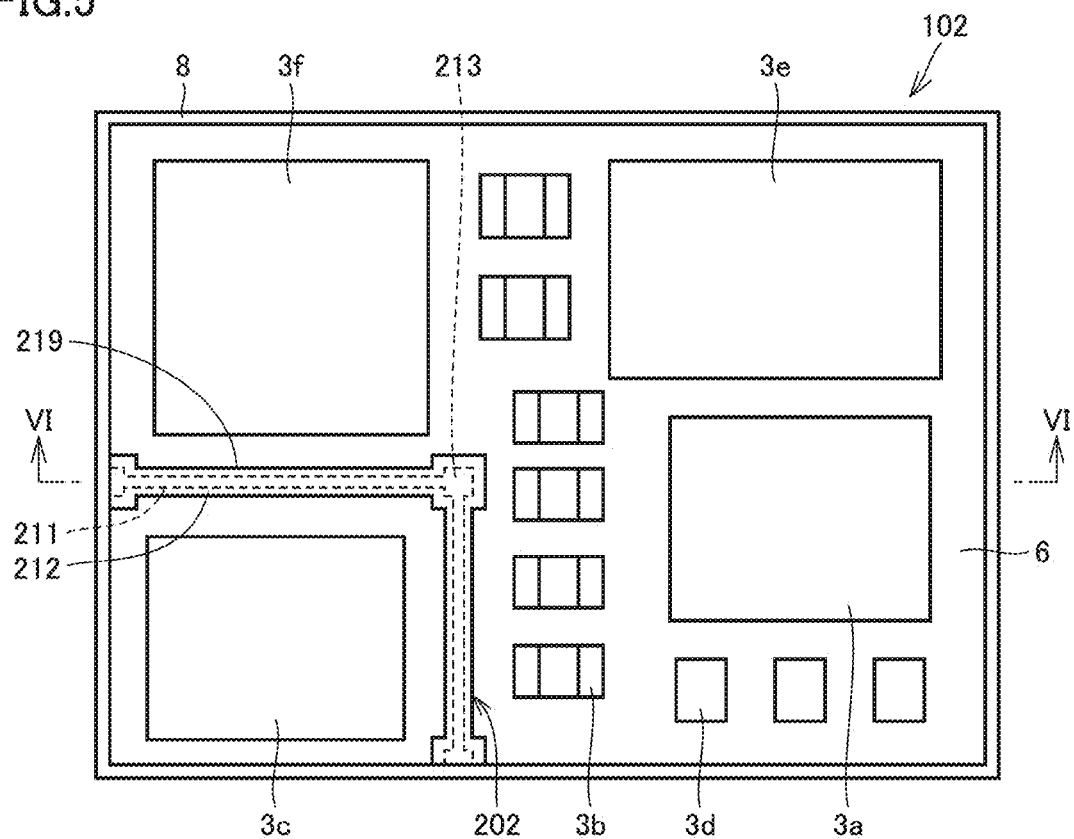
FIG. 5 is a transparent plan view of a module according to a second exemplary embodiment.
Figure 6:
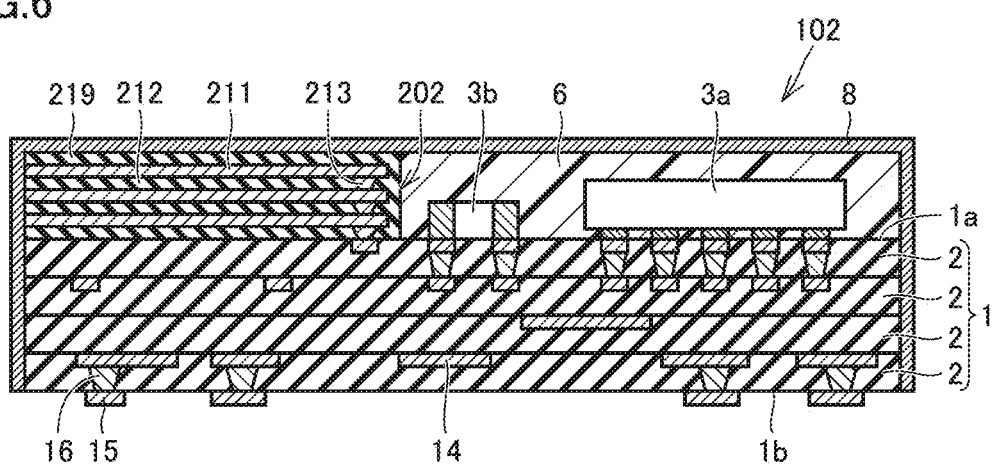
FIG. 6 is a cross section taken along a line VI-VI indicated in FIG. 5.
Figure 7:
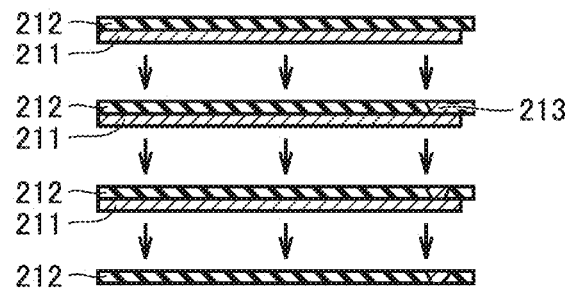
FIG. 7 is an exploded view of a conductor incorporated resin body included in the module according to the second exemplary embodiment.

A module according to a second exemplary embodiment will now be described with reference to FIGS. 5 to 7. FIG. 5 is a transparent plan view of a module 102 in the present embodiment. FIG. 6 is a cross section taken along a line VI-VI indicated in FIG. 5.

Module 102 comprises a conductor incorporated resin body 202 instead of conductor incorporated resin body 201. Conductor incorporated resin body 202 is mounted on major surface 1a of wiring substrate 1. FIG. 7 is an exploded view of conductor incorporated resin body 202. A conductor via 213 is formed in some of the plurality of resin layers 212. As shown, conductor via 213 penetrates resin layer 212 in a thickness-wise direction. Conductor incorporated resin body 202 has conductor patterns 211 electrically interconnected by conductor via 213. As shown in FIG. 5, conductor pattern 211 has an L-shape, and conductor via 213 is located at a corner of conductor pattern 211. At the corner of conductor pattern 211, a plurality of conductor vias 213 are provided contiguously in the thickness-wise direction. Conductor incorporated resin body 202 includes wall-shaped portion 219.

The remainder in configuration is similar to module 101 described in the first embodiment. In the configuration of the present embodiment, conductor pattern 211 and conductor via 213 are connected to each other, and conductor pattern 211 can be connected to the GND electrode of wiring substrate 1 via conductor via 213. Therefore, the conductor incorporated resin body can have conductor pattern 211 grounded even if wiring pattern 211 is not electrically connected to shield film 8.

In general, it is noted that the present embodiment can have an effect similar to that described in the first embodiment.

Third Exemplary Embodiment

Figure 8:
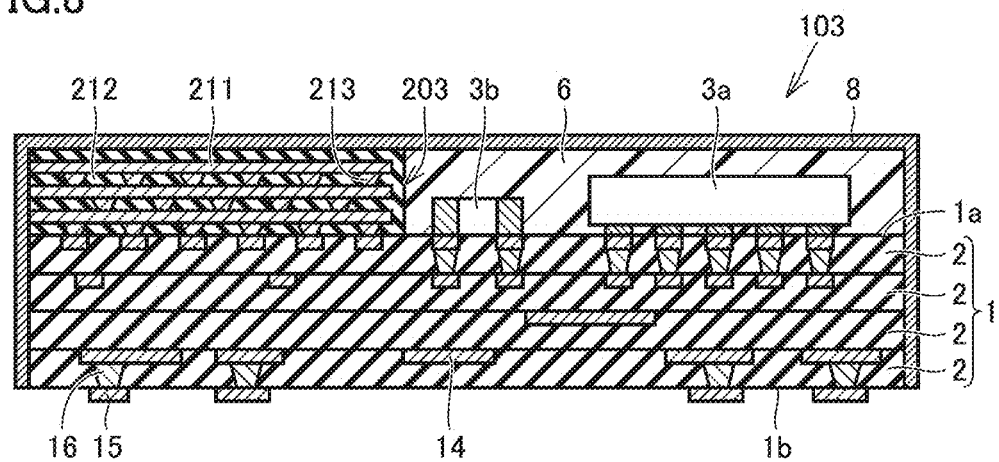
FIG. 8 is a cross section of a module according to a third exemplary embodiment.

A module according to a third exemplary embodiment will now be described with reference to FIG. 8. FIG. 8 is a cross section of a module 103 in the present embodiment.

Module 103 comprises a conductor incorporated resin body 203 instead of conductor incorporated resin body 201. Conductor incorporated resin body 203 is mounted on major surface 1a of wiring substrate 1. In conductor incorporated resin body 203, when attention is paid to two conductor patterns 211 adjacent to each other in a vertical direction, a plurality of conductor vias 213 are disposed between these conductor patterns 211. When attention is paid to two resin layers 212 adjacent to each other in the vertical direction, conductor vias 213 penetrating these resin layers 212, respectively, are disposed so as to be shifted in position, rather than contiguous in the vertical direction. In other words, conductor incorporated resin body 203 includes conductor via 213 therein, and conductor pattern 211 and conductor via 213 are combined to form a structure made of a conductor.

The remainder in configuration is similar to module 101 described in the first embodiment. In general, it is noted that the present embodiment can have an effect similar to that described in the first embodiment.

Fourth Exemplary Embodiment

Figure 9:
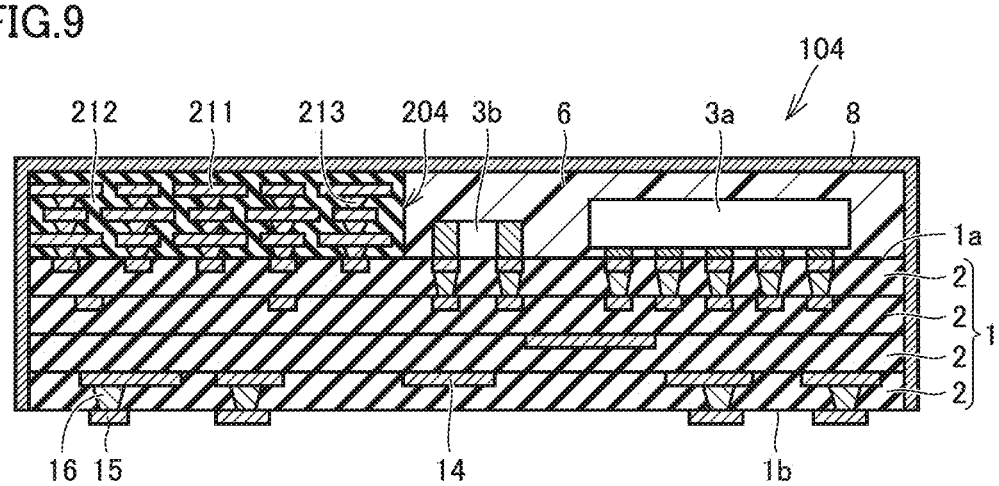
FIG. 9 is a cross section of a module according to a fourth exemplary embodiment.

A module according to a fourth exemplary embodiment will now be described with reference to FIG. 9. FIG. 9 is a cross section of a module 104 in the present embodiment.

As shown, module 104 comprises a conductor incorporated resin body 204 instead of conductor incorporated resin body 201. Conductor incorporated resin body 204 is mounted on major surface 1a of wiring substrate 1. Conductor incorporated resin body 204 has conductor pattern 211 divided into small pieces. Conductor patterns 211 are interconnected by conductor via 213. A plurality of conductor vias 213 are disposed contiguously in the thickness-wise direction.

In general, it is noted that the present embodiment can have an effect similar to that described in the first embodiment. Further, the conductor pattern is choppy, which suppresses generation of an eddy current caused by an electromagnetic wave.

Fifth Exemplary Embodiment

Figure 10:
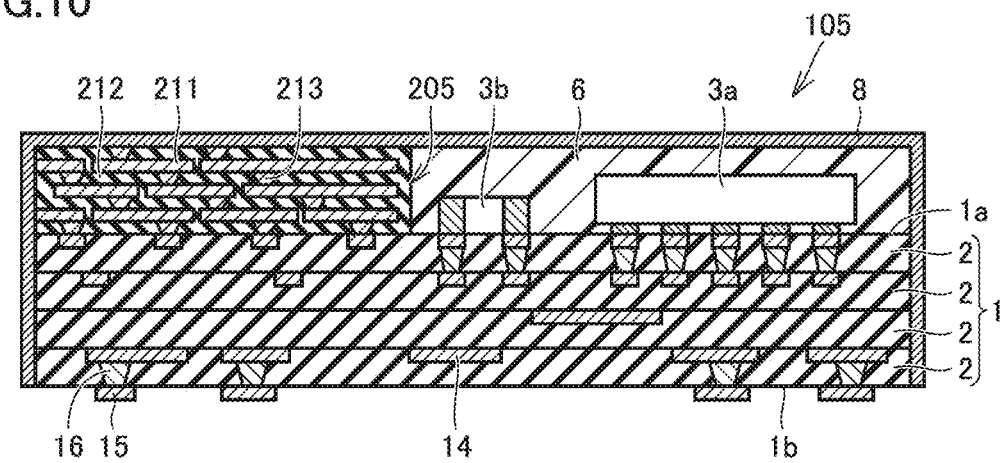
FIG. 10 is a cross section of a module according to a fifth exemplary embodiment.

A module according to a fifth exemplary embodiment will now be described with reference to FIG. 10. FIG. 10 is a cross section of a module 105 in the present embodiment.

Module 105 comprises a conductor incorporated resin body 205 instead of conductor incorporated resin body 201. Conductor incorporated resin body 205 is mounted on major surface 1a of wiring substrate 1. Conductor incorporated resin body 205 has conductor pattern 211 divided into small pieces. When attention is paid to two resin layers 212 adjacent to each other in the vertical direction, conductor vias 213 penetrating these resin layers 212, respectively, are disposed so as to be shifted in position, rather than contiguous in the vertical direction.

In the example indicated herein, conductor vias 213 are further provided on an upper surface of that conductor pattern 211 in conductor incorporated resin body 205 which is located on an uppermost side, and these conductor vias 213 are electrically connected to shield film 8 covering an upper surface of sealing resin 6. Thus electrically connecting conductor pattern 21 to shield film 8 covering the upper surface of sealing resin 6 is preferable as doing so can provide more reliable grounding. This also applies to the other embodiments.

In general, it is noted that the present embodiment can have an effect similar to that described in the first embodiment. In module 105, conductor incorporated resin body 205 has conductor pattern 211 cut at dispersed locations, and can thus be larger in strength than conductor incorporated resin body 204.

Sixth Exemplary Embodiment

Figure 11:
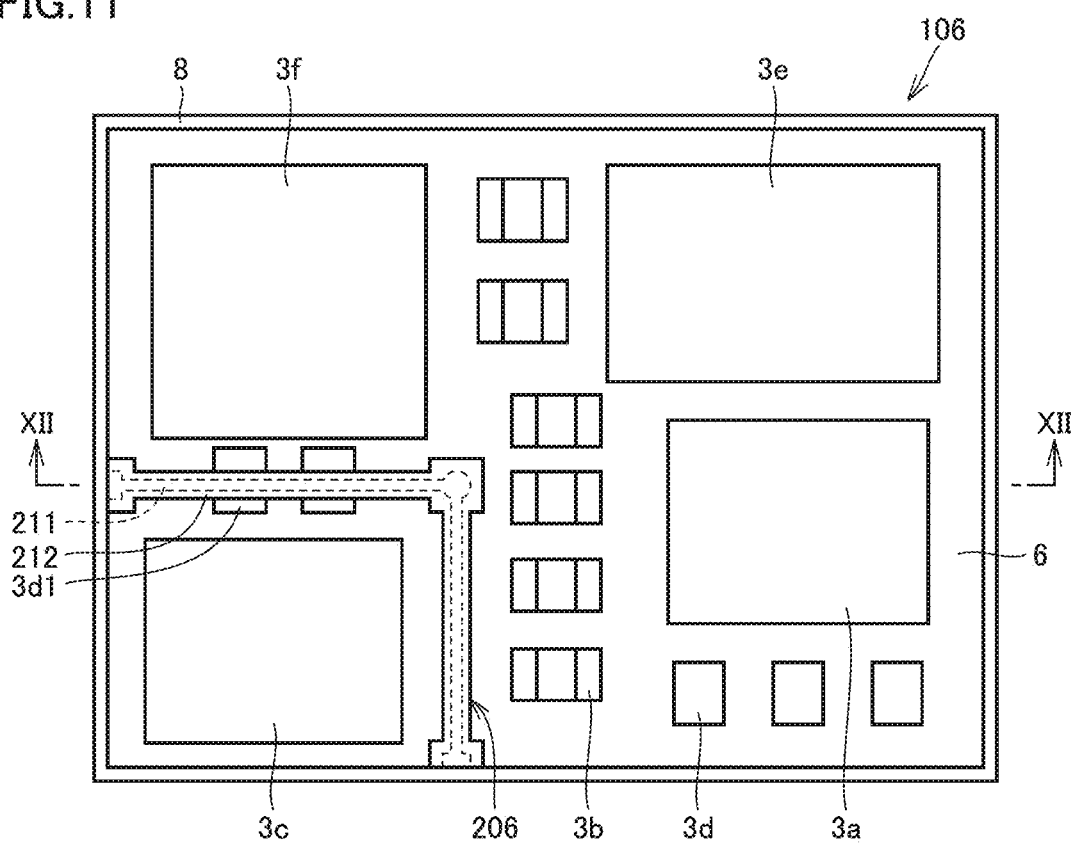
FIG. 11 is a transparent plan view of a module according to a sixth exemplary embodiment.
Figure 12:
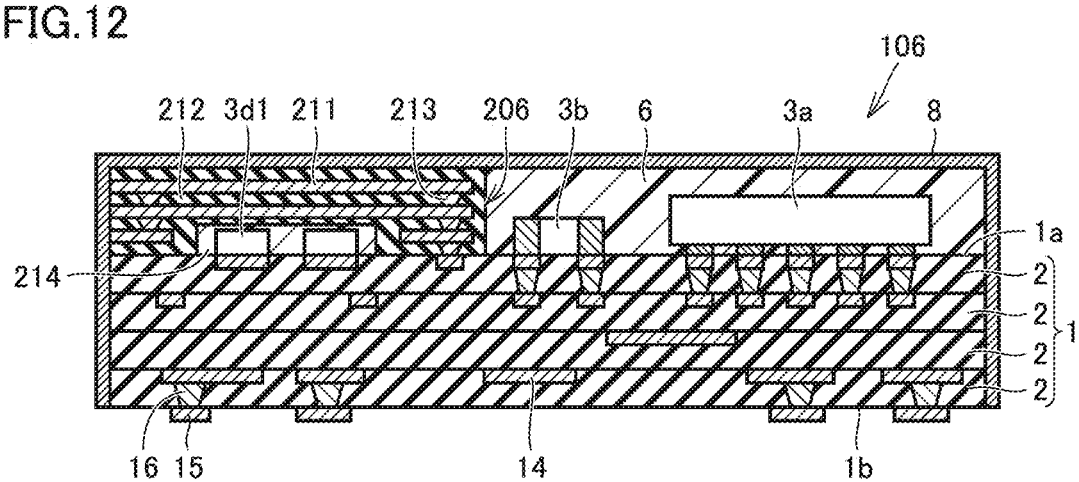
FIG. 12 is a cross section taken along a line XII-XII indicated in FIG. 11.

A module according to a sixth exemplary embodiment will now be described with reference to FIGS. 11 and 12. FIG. 11 is a transparent plan view of a module 106 in the present embodiment. FIG. 12 is a cross section taken along a line XII-XII indicated in FIG. 11.

As shown, module 106 has component 3a, 3b, 3c, 3d, 3d1, 3e and 3f mounted on major surface 1a of wiring substrate 1. Module 106 comprises a conductor incorporated resin body 206. Conductor incorporated resin body 206 is mounted on major surface 1a of wiring substrate 1. Conductor incorporated resin body 206 is disposed so as to straddle component 3d1.

As shown in FIG. 12, conductor incorporated resin body 206 has a wall-shaped structure with a notch 214 (e.g., an opening or cavity) in a side view. Two components 3d1 are accommodated in notch 214. While an example with two components 3d1 accommodated is shown, this is merely an example and it is noted that the type, number, and size of the components are not limited to those indicated. Conductor incorporated resin body 206 may straddle more components. Conductor incorporated resin body 206 may straddle a combination of different types of components. Conductor incorporated resin body 206 may not have notch 214 only at one location, and may instead have it at two or more locations.

In general, it is noted that the present embodiment can have an effect similar to that described in the first embodiment. The present embodiment provides the conductor incorporated resin body in a structure so as to straddle a component, and thus, in plan view, allows the component to be disposed in a space occupied by the conductor incorporated resin body and can thus ensure a larger space for mounting components.

Seventh Exemplary Embodiment

Figure 13:
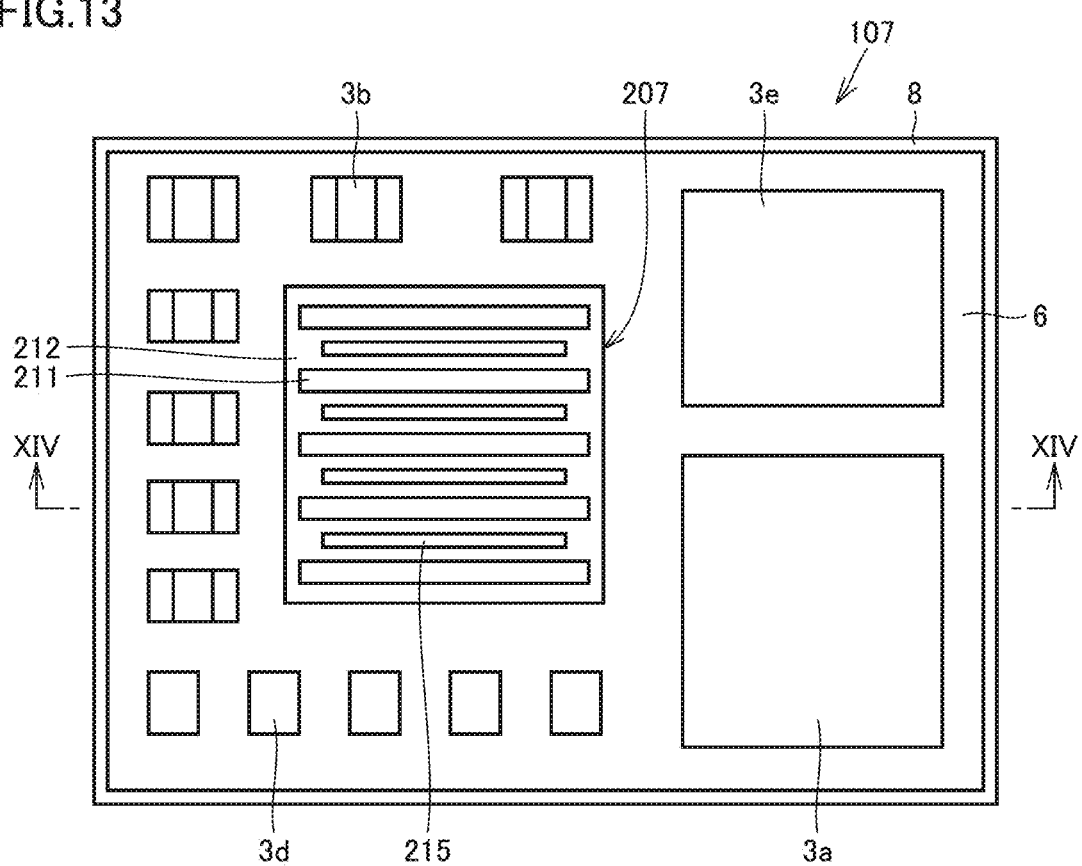
FIG. 13 is a transparent plan view of a module according to a seventh exemplary embodiment.
Figure 14:
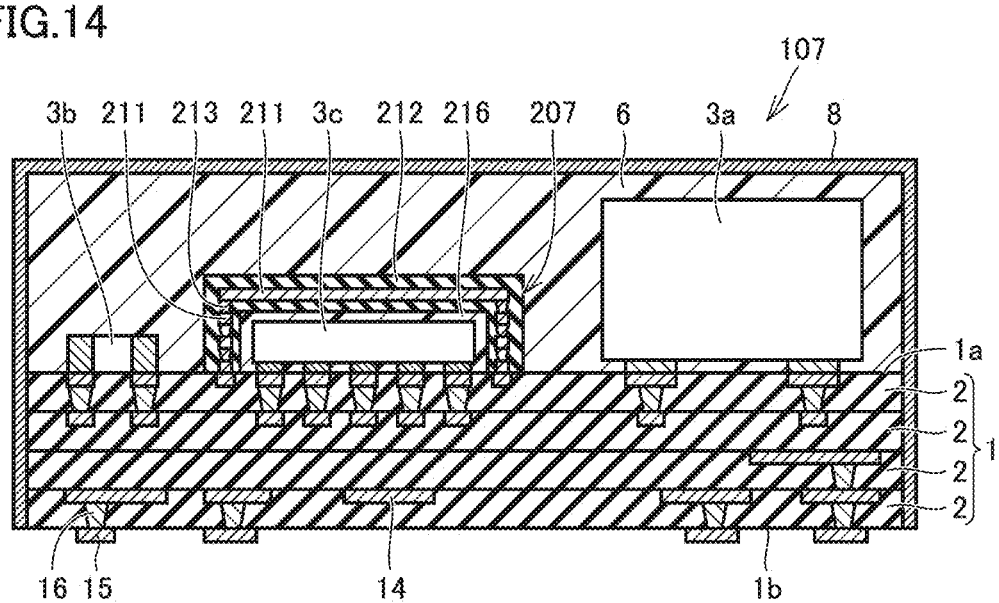
FIG. 14 is a cross section taken along a line XIV-XIV indicated in FIG. 13.

A module according to a seventh exemplary embodiment will now be described with reference to FIGS. 13 to 16. FIG. 13 is a transparent plan view of a module 107 in the present embodiment. FIG. 14 is a cross section taken along a line XIV-XIV indicated in FIG. 13.

Module 107 has components 3a, 3b, 3c, 3d, and 3e mounted on major surface 1a of wiring substrate 1. Module 107 comprises a conductor incorporated resin body 207. Conductor incorporated resin body 207 is mounted on major surface 1a of wiring substrate 1.

Conductor incorporated resin body 207 is disposed so as to include a portion overlapping an upper side of component 3c. Conductor incorporated resin body 207 is in the form of a box. As shown in FIG. 14, conductor incorporated resin body 207 has a cavity 216. Component 3c is accommodated in cavity 216. Sealing resin 6 fills a surrounding of component 3c.

Figure 15:
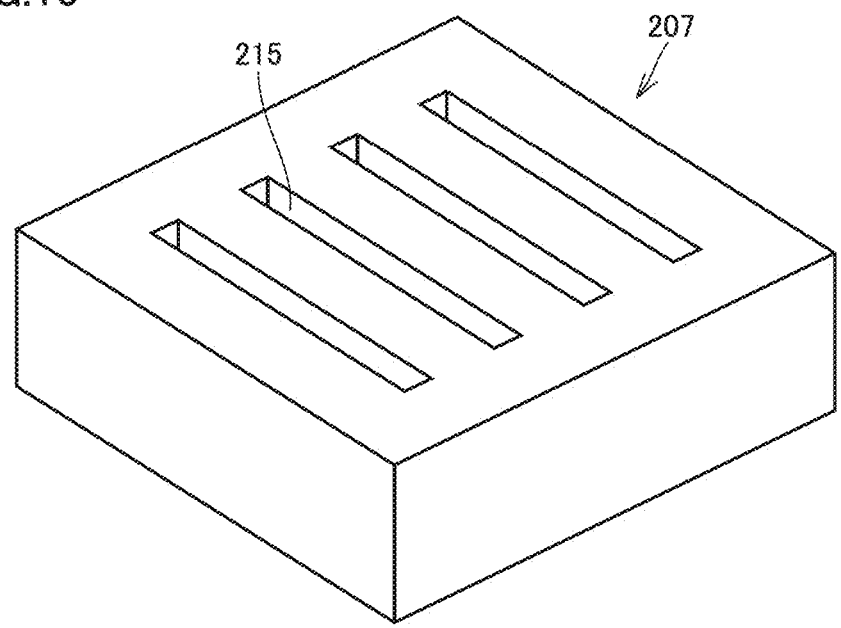
FIG. 15 is a first perspective view of a conductor incorporated resin body included in the module according to the seventh exemplary embodiment.
Figure 16:
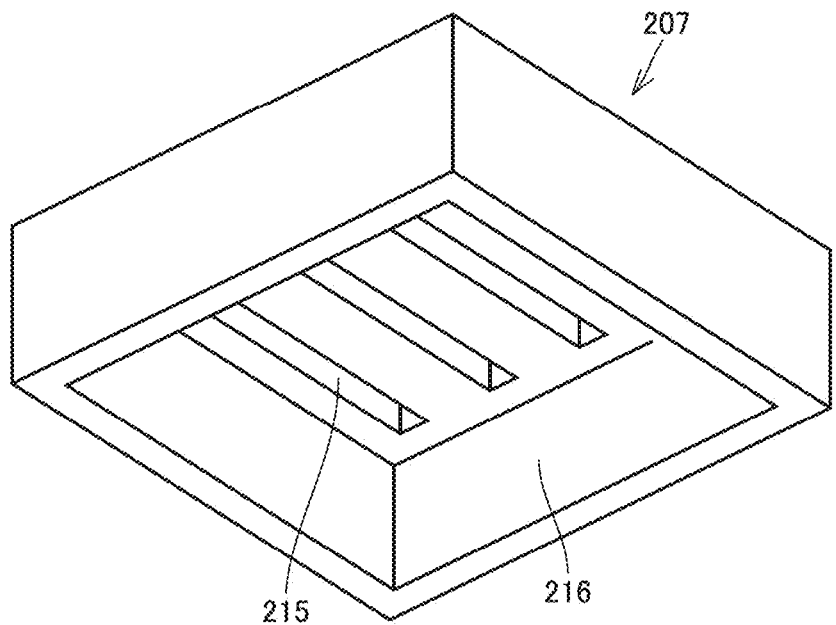
FIG. 16 is a second perspective view of the conductor incorporated resin body included in the module according to the seventh exemplary embodiment.

FIG. 15 shows conductor incorporated resin body 207 alone extracted and viewed from above obliquely. FIG. 16 shows conductor incorporated resin body 207 viewed from below obliquely. A slit 215 serves as an entrance for sealing resin 6 to flow into cavity 216.

The present embodiment can have an effect similar to that described in the first embodiment. The present embodiment can more reliably provide a shield for component 3c disposed in cavity 216.

Eighth Exemplary Embodiment

Figure 17:
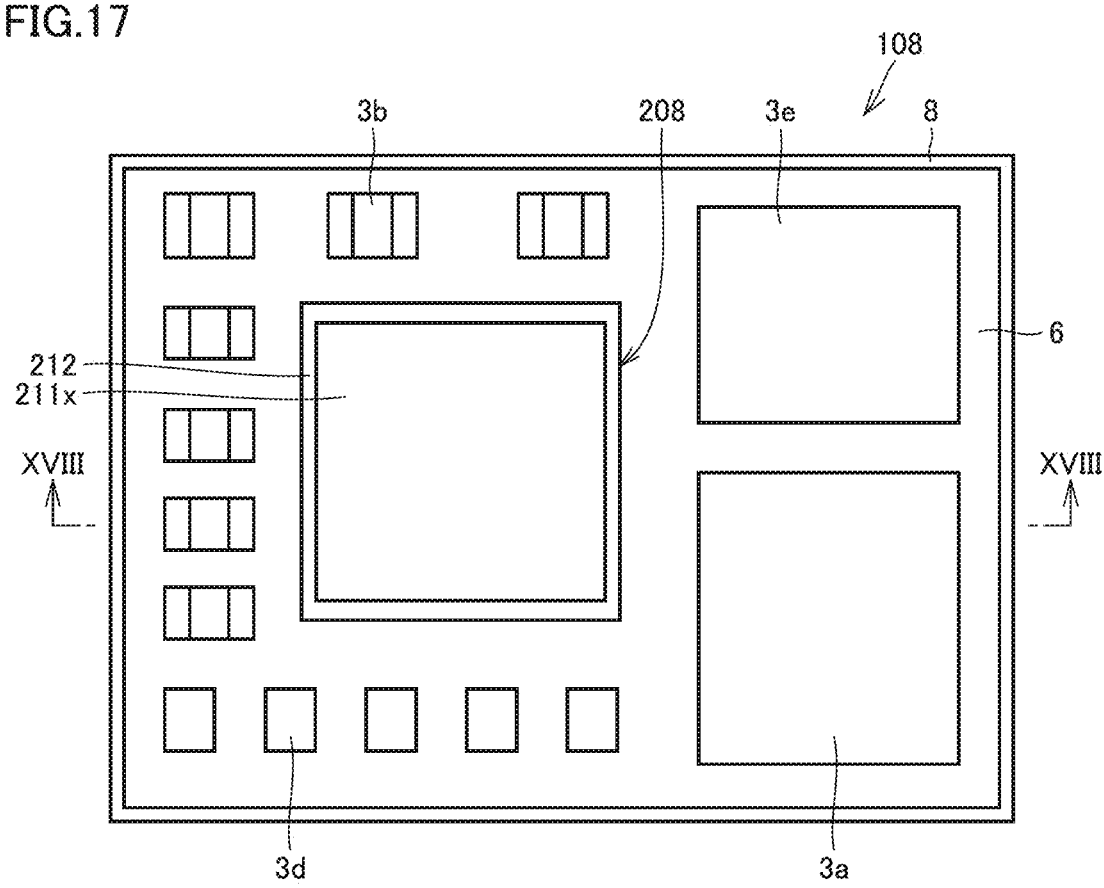
FIG. 17 is a transparent plan view of a module according to an eighth exemplary embodiment.
Figure 18:
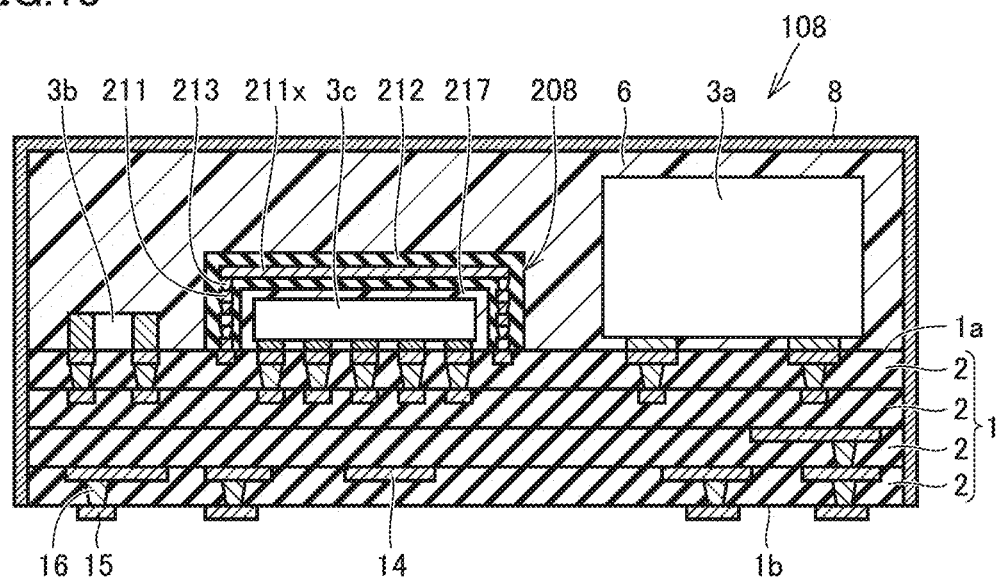
FIG. 18 is a cross section taken along a line XVIII-XVIII indicated in FIG. 17.

A module according to an eighth exemplary embodiment will now be described with reference to FIG. 17. FIG. 17 is a transparent plan view of a module 108 in the present embodiment. FIG. 18 is a cross section taken along a line XVIII-XVIII indicated in FIG. 17.

Figure 19:
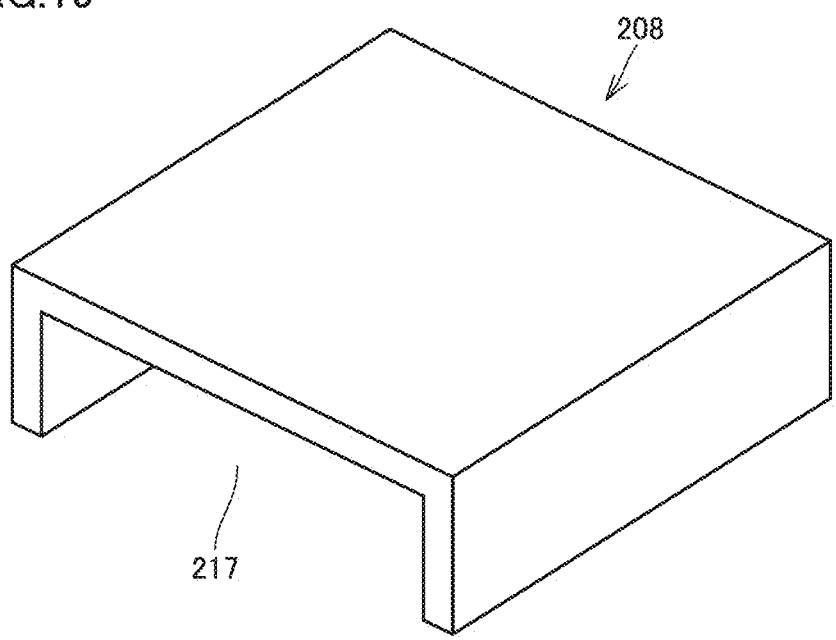
FIG. 19 is a first perspective view of a conductor incorporated resin body included in the module according to the eighth exemplary embodiment.
Figure 20:
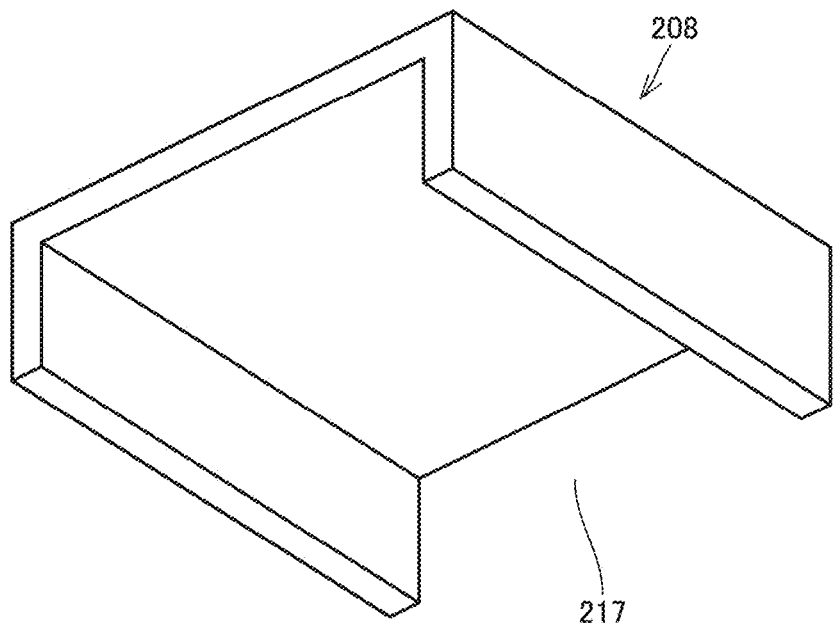
FIG. 20 is a second perspective view of the conductor incorporated resin body included in the module according to the eighth exemplary embodiment.

Module 108 has components 3a, 3b, 3c, 3d, and 3e mounted on major surface 1a of wiring substrate 1. Module 108 comprises a conductor incorporated resin body 208. Conductor incorporated resin body 208 is mounted on major surface 1a of wiring substrate 1. FIG. 19 shows conductor incorporated resin body 208 alone extracted and viewed from above obliquely. FIG. 20 shows conductor incorporated resin body 208 viewed from below obliquely.

As shown, conductor incorporated resin body 208 is disposed so as to include a portion overlapping an upper side of component 3c. Conductor incorporated resin body 208 has four sides with two sides thereof each having a side surface opened. As shown in FIG. 18, conductor incorporated resin body 208 has a notch 217. Component 3c is accommodated in notch 217.

In general, it is noted that the present embodiment can have an effect similar to that described in the first embodiment. Module 108 has conductor incorporated resin body 208 with two side surfaces opened and thus allows sealing resin 6 to smoothly flow into notch 217.

Figure 21:
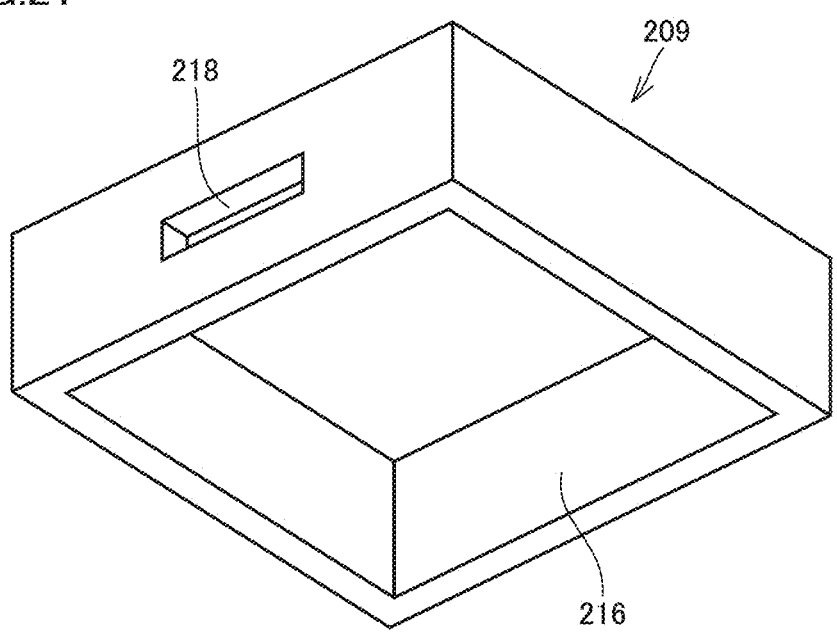
FIG. 21 is a perspective view of a conductor incorporated resin body included in a modified example of the module according to the eighth exemplary embodiment.

As a modified example of the present embodiment, a module may include a conductor incorporated resin body 209 as shown in FIG. 21 instead of conductor incorporated resin body 208. Conductor incorporated resin body 209 has four sides each having a plate-shaped member configuring a side surface. At least one of the four sides has the plate-shaped member with an opening 218 provided therethrough. Opening 218 is provided for allowing sealing resin 6 to flow into cavity 216. While herein one side surface is provided with only one opening 218 by way of example, one side surface may be provided with a plurality of openings 218.

Ninth Exemplary Embodiment

Figure 22:
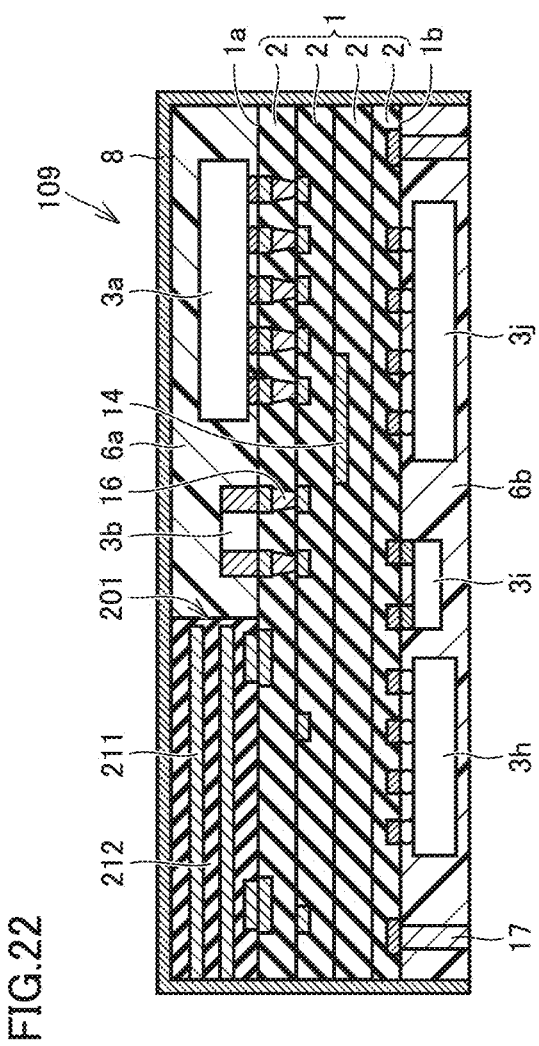
FIG. 22 is a cross section of a module according to a ninth exemplary embodiment.

A module according to a ninth exemplary embodiment will now be described with reference to FIG. 22. FIG. 22 is a cross section of a module 109 in the present embodiment.

Module 109 has a double-sided mounting structure. That is, module 109 also has one or more components mounted on a surface of wiring substrate 1 opposite to major surface 1a. In the example shown in FIG. 22, components 3h, 3i, and 3j are mounted on lower surface 1b. A sealing resin 6a is disposed so as to cover major surface 1a, components 3a, 3b, and the like. A sealing resin 6b is disposed so as to cover lower surface 1b and components 3h, 3i, and 3j. On lower surface 1b, a columnar conductor 17 is provided so as to penetrate through sealing resin 6b. An end surface of lower surface 1b located on a side farther away from wiring substrate 1 is exposed from sealing resin 6b and serves as an external connection terminal. The end surface may further be soldered. Any or all of components 3h, 3i, and 3j may be exposed from sealing resin 6b.

In general, it is noted that the present embodiment can have an effect similar to that described in the first embodiment. Further, the present embodiment that adopts a double-sided mounting structure allows wiring substrate 1 having a limited area to comprise more components. While herein the configuration of the first embodiment is modified to form a double-sided mounting structure by way of example, those of the other embodiments may be modified to form a double-sided mounting structure.

In general, it is noted that a plurality of the above embodiments may be combined as appropriate and employed. Moreover, it should be understood that the embodiments disclosed herein are illustrative and non-restrictive in any respect.

REFERENCE SIGNS LIST 1 wiring substrate, 1a major surface, 1b lower surface, 2 insulating layer, 3a, 3b, 3c, 3d, 3e, 3f, 3h, 3i, 3j component, 6, 6a, 6b sealing resin, 8 shield film, 14 conductor pattern, 15 external electrode, 16 conductor via, 17 columnar conductor, 101, 102, 103, 104, 105 106, 107, 108, 109 module, 201, 202, 203, 204, 205, 206, 207, 208, 209 conductor incorporated resin body, 211, 211*x* conductor pattern, 212 resin layer, 213 conductor via, 214, 217 notch, 215 slit, 216 cavity, 218 opening, 219 wall-shaped portion.

The invention claimed is:

1. A module comprising:
a wiring substrate having a first surface;
a plurality of components mounted on the first surface; and
a conductor incorporated resin body mounted on the first surface and that is disposed between the plurality of components,
wherein the conductor incorporated resin body comprises a plurality of resin layers and a conductor pattern that is grounded and that includes a plurality of linear patterns disposed between the plurality of resin layers, such that the respective linear patterns are electrically insulated from each other by the respective resin layers that continuously extend between the respective linear patterns without any electrical interconnects extending between the respective linear patterns.

2. The module according to claim 1, wherein the conductor incorporated resin body includes a wall-shaped portion having the conductor pattern disposed therein.

3. The module according to claim 1, wherein the conductor incorporated resin body is disposed so as to straddle at least one component of the plurality of components.

4. The module according to claim 1, wherein the conductor incorporated resin body is disposed so as to include a portion overlapping an upper side of at least one component of the plurality of components.

5. The module according to claim 1, wherein the conductor incorporated resin body is a multilayer resin body.

6. The module according to claim 1, wherein one or more components of the plurality of components are also mounted on a second surface of the wiring substrate opposite to the first surface.

7. The module according to claim 1, wherein the conductor incorporated resin body comprises an L-shaped conductor in a plan view of the first surface of the wiring substrate.

8. The module according to claim 2, further comprising a sealing resin that seals at least one component of the plurality of components on the first surface of the wiring substrate.

9. The module according to claim 5, wherein the multilayer resin body comprises the plurality of resin layers with the conductor pattern being disposed between opposing surfaces of the plurality of resin layers.

10. The module according to claim 7, wherein an entire periphery of one or more components of the plurality of components is surrounded by the conductor in the plan view of the first surface of the wiring substrate.

11. The module according to claim 8, wherein the wall-shaped portion is disposed to isolate a portion of the sealing resin from another portion thereof.

12. The module according to claim 8, further comprising a shield film that covers an upper surface of the sealing resin and a side surface of the sealing resin.

13. The module according to claim 9, wherein the multilayer resin body comprises the conductor pattern being divided into a plurality of individual pieces that includes the plurality of linear patterns, respectively.

14. The module according to claim 9, wherein the conductor incorporated resin body is disposed on the first surface between at least two of the plurality of components relative to a plan view of the first surface of the wiring substrate.

15. The module according to claim 12, wherein the shield film is electrically connected to the conductor pattern.

16. A module comprising:
a wiring substrate having first surface;
a plurality of components mounted on the first surface;
a resin body mounted on the first surface and that is disposed between at least two components of the plurality of components;
a sealing resin that seals at least one of the two components; and
a shield film that covers at least an upper surface of the sealing resin,
wherein the resin body comprises a plurality of resin layers and a conductor pattern hat is grounded by being electrically connected to the shield film, and
wherein the conductor pattern includes a plurality of linear patterns disposed between the plurality of resin layers, respectively, such that the respective linear patterns are electrically insulated from each other by the respective resin layers that continuously extend between the respective linear patterns without any electrical interconnects extending between the respective linear patterns.

17. The module according to claim 16, wherein the shield film is electrically connected to a ground electrode provided to wiring substrate.

* * * * *